United States Patent [19]

Crowe et al.

[11] Patent Number: 5,053,358

[45] Date of Patent: * Oct. 1, 1991

[54] METHOD OF MANUFACTURING HERMETICALLY SEALED COMPRESSION BONDED CIRCUIT ASSEMBLIES

[75] Inventors: Lawrence E. Crowe, Lindenwood; Thomas A. Sutrina, Rockford, both of Ill.

[73] Assignee: Sundstrand Corporation, Rockford, Ill.

[*] Notice: The portion of the term of this patent subsequent to May 16, 2006 has been disclaimed.

[21] Appl. No.: 351,537

[22] Filed: May 15, 1989

Related U.S. Application Data

[63] Continuation of Ser. No. 226,682, Aug. 1, 1988, Pat. No. 4,830,979.

[51] Int. Cl.$^5$ ............................................. H01L 25/14
[52] U.S. Cl. .................................... 437/216; 437/222
[58] Field of Search ................ 437/216, 222; 357/74, 357/81

[56] References Cited

U.S. PATENT DOCUMENTS

| | | |
|---|---|---|
| 3,708,720 | 1/1973 | Whitney et al. |
| 4,477,826 | 10/1984 | Oley . |
| 4,499,485 | 2/1985 | Schierz et al. |
| 4,591,896 | 5/1986 | Kikuchi . |
| 4,613,892 | 9/1986 | Sutrina et al. |

FOREIGN PATENT DOCUMENTS 59-65460  4/1984  Japan .

*Primary Examiner*—Olik Chaudhuri
*Assistant Examiner*—Andrew Griffis
*Attorney, Agent, or Firm*—Antonelli, Terry, Stout & Kraus

[57] ABSTRACT

A method of manufacturing hermetically sealed circuit assemblies (10) having circuit elements (74, 76, 78 and 80) to be compression bonded, a hermetically sealed circuit assembly having circuit elements to be compression bonded and a stack containing at least one hermetically sealed circuit assembly having circuit elements which are compression bonded is disclosed. Uniform thickness of individual hermetically sealed circuit assemblies measured across columns (22–30) is insured by positioning deformable spacers (124–132) in the columns containing the circuit elements to be compression bonded, and deforming the deformable spacers so that a surface of each of the deformed spacers lies within a single plane. Thereafter a compressive force is applied to a stack of one or more circuits through the columns which contain the circuit elements to be compression bonded. The individual hermetically sealed circuit assemblies have circular corrugations (32–40) in a flat surface (14) and circular corrugations (114–122) in a lid (20) which are disposed within the columns containing the individual circuit elements to be compression bonded to permit freedom of motion in all directions of the individual circuit elements to be compression bonded without applying torsional or other loads to any other circuit elements to be compression bonded. Furthermore, all circuit buses (50, 52, 54 and 68) contain one or more corrugations (56, 58, 60, 62, 64 and 66) between each circuit element to be compression bonded and external connections (42–48) to couple the circuit elements to be compression bonded to the exterior of the hermetically sealed chamber (200) and in circuit buses between any adjacent circuit elements to be compression bonded.

39 Claims, 9 Drawing Sheets

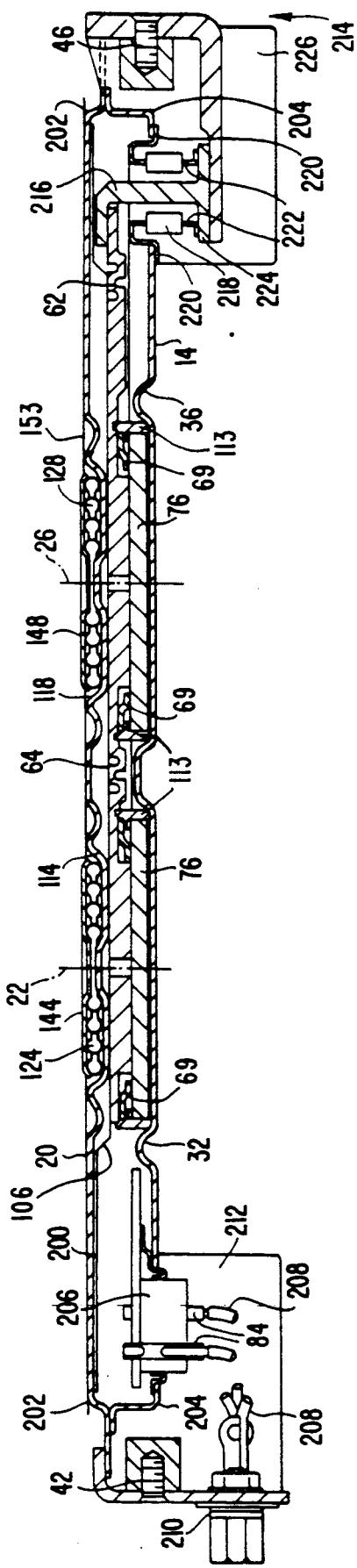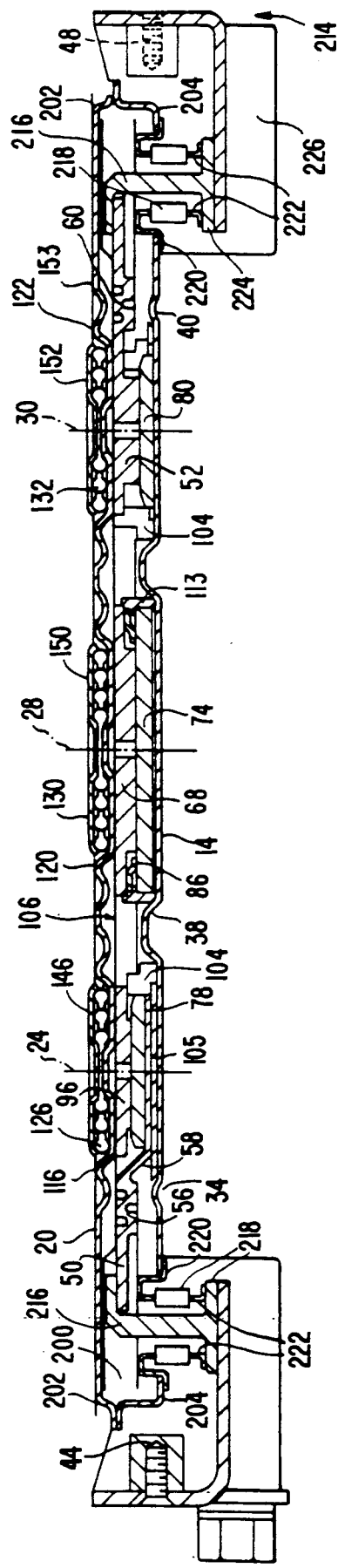

METHOD OF MANUFACTURING HERMETICALLY SEALED COMPRESSION BONDED CIRCUIT ASSEMBLIES

This is a continuation of application Ser. No. 226,682, filed Aug. 1, 1988, now U.S. Pat. No. 4,830,979.

CROSS-REFERENCE TO RELATED APPLICATIONS

Reference is made to the following related applications which are filed on even date herewith and which are incorporated herein by reference in their entirety.

(1) Compression Bonded Semiconductor Device Having a Plurality of Stacked Hermetically Sealed Circuit Assemblies. (Application Ser. No. 07/226683).

(2) Hermetically Sealed Compression Bonded Circuit Assembly Having Flexible Walls at Points of Application of Pressure for Compression Bonding Circuit Elements. (U.S. Pat. No. 4,954,876).

(3) Hermetically Sealed Compression Bonded Circuit Assembly Having A Suspension for Compression Bonded Semiconductor Elements. (U.S. Pat. No. 4,985,752).

TECHNICAL FIELD

The present invention relates to an individual hermetically sealed circuit assembly having a plurality of circuit elements to be compression bonded which are contained in a hermetically sealed chamber, to one or more stacked hermetically sealed circuit assemblies which have force applied to compression bond the circuit elements within the one or more circuit assemblies and to a process for manufacturing hermetically sealed circuit assemblies. The present invention also relates to circuit assemblies of the foregoing type which are useful for high power applications such as in inverters in airframes for converting DC to AC having reduced weight, high reliability, faster switching speeds and higher efficiency.

BACKGROUND ART

Compressive bonded semiconductor elements are widely in use. These semiconductor elements establish electrical and thermal contact without external leads by means of a force applied orthogonal to surfaces of the semiconductor elements to be compression bonded. Manufacturers of compression bonded semiconductor elements specify a nominal desired compressive bonding pressure at which the semiconductor elements are to operate plus a range around the nominal pressure at which each element is designed to operate. The specified pressure varies depending upon the type of the element and its design. Operation outside the specified pressure range can cause circuit malfunction or failure of the compression bonded elements.

Hermetically sealed circuit assemblies having two or more compression bonded circuit elements contained within a hermetically sealed chamber are known. U.S. Pat. No. 3,575,574 discloses individual non-hermetically sealed circuits each containing three compression bonded elements which are contained in a stack having a plurality of the circuit assemblies. The stack is contained in a hermetically sealed chamber. Supports for the individual circuit assemblies do not include any structures for equalizing force between the different columns of compression bonded circuit elements of the stack of circuit assemblies. Furthermore, stacked individual circuit assemblies each having three circuit elements to be compression bonded which are disposed in three columns do not present as serious a problem in achieving specified operating pressures as circuit assemblies having four or more circuit elements to be compression bonded. A universal joint is disclosed in the '574 patent which provides for adjustable movement of heat sinks with respect to the compression bonded circuit element. U.S. Pat. No. 4,313,128 discloses a single hermetically sealed power hybrid circuit assembly. A heat sink to control operating temperature thermally contacts the compression bonded power circuit elements which extends below the bottom wall of a hermetically sealed chamber containing the compression bonded circuit elements. The hermetically sealed semiconductor circuit assembly disclosed in the '128 patent is not designed to be stacked in a stack including multiple circuit assemblies which are clamped together to provide the requisite compressive force for operation. The compressive force in the device disclosed in the '128 patent is established by the bonding of the top and bottom walls of the hermetically sealed chamber through a side member.

Single compression bonded circuit elements in a hermetically sealed chamber are commercially available. These hermetically sealed circuit elements may be stacked and compression bonded by clamping the stack. These elements may have a corrugation in the opposed surfaces defining the hermetically sealed chamber which provides for relieving stresses due to welding and brazing.

Corrugated bus structures are known to relieve stress. U.S. Pat. No. 4,583,005 discloses a circular corrugated bus and a spider-like conductor which each contain corrugations for relieving thermal stress. A plurality of rings of semiconductor devices are electrically contacted with the circular bus. The individual semiconductor devices are also contacted by the spider-like conductor.

Clamping structures for compressively loading stacked compression bonded semiconductor circuit elements which apply force to a central axis containing the stacked semiconductor circuit elements are known. U.S. Pat. No. 4,504,850 discloses the clamping of a stack of compression bonded circuit elements by application of a force to a convex surface at the axis of the stacked semiconductor circuit elements. Furthermore, swivel, ball and gimbal mounts are known for performing the function of the convex surface to apply uniform force to the central axis of the stacked semiconductor element.

Mechanisms for applying force to columns of stacked compression bonded circuit elements are known. These mechanisms use a force applying member to apply a force to the central axis of the stacked compression bonded semiconductor elements which is sufficient to apply the requisite pressure for normal operation. Bellville washers have been used to apply force to each column of stacked semiconductor circuit elements. See U.S. Pat. No. 3,551,758. Furthermore, coil springs have been used to apply an axial force to each of the columns of stacked semiconductor compression bonded devices by application to an end part of the stack. See U.S. Pat. No. 3,573,574 discussed above. Additionally, it is known to apply compressive force to load stacked compression bonded semiconductor circuit elements by the application of torque to a threaded connecting member which is attached to rigid end plates of the stack. See U.S. Pat. Nos. 3,652,903, 3,936,704 and 4,268,850.

Individual compressed coil springs have been used to load pairs of semiconductor elements to establish desired operating pressure. Opposed faces of the coil spring are in surface contact with first and second compression bonded semiconductor devices. See U.S. Pat. No. 3,921,201.

Compression bonding of a plurality of individual circuit assemblies each having four or more semiconductor elements contained in four or more columns presents special problems in achieving the desired operating pressures in each of the columns. This problem is analogous to leveling a four legged chair in which any variation in the length of one of the legs will cause three of the legs to lie in a single plane with the fourth leg not being in surface contact with the plane containing the three legs unless each of the legs is exactly of the same length. It is for this reason that the establishment of desired operating pressures for compression bonded circuit assemblies are more easily established when only three compression bonded circuit elements disposed in separate columns to be compression bonded are contained in each circuit assembly of a stack of multiple circuit assemblies.

DISCLOSURE OF INVENTION

The present invention is a method of manufacturing a semiconductor device having at least one hermetically sealed compression bonded circuit assembly disposed in a stack to a force is applied to columns containing at least one compression bond circuit element within the stack of individual circuit assemblies. The invention also is a hermetically sealed circuit assembly, containing at least one circuit element to be compression bonded, with each circuit element being suspended in separate columns by deformed shims, springs or a distributed spring function within the columns within or outside the hermetically sealed circuit assembly with each circuit element being compression bonded upon the application of a force to opposed first and second walls of a hermetically sealed chamber containing the circuit elements. Moreover, the invention is a hermetically sealed circuit assembly containing at least one circuit element to be compression bonded with each circuit element being disposed in a separate column with the at least one circuit element being compression bonded by the application of force to first and second walls of a hermetically sealed chamber containing the circuit elements with the walls and circuit buses within the chamber containing structures which permit flexation of the columns of the at least one circuit elements within the hermetically sealed circuit assembly. Finally, the invention is a compression bonded semiconductor device having at least one individual hermetically sealed circuit assembly contained in a stack to which is applied a force to compression bond at least one individual circuit element within the individual hermetically sealed circuit assemblies with the at least one individual circuit element of each circuit assembly being located in aligned columns within the stack.

With the invention individual hermetically sealed circuit assemblies having any number of compression bonded circuit elements may be made while maintaining pressure on the individual circuit elements within a range of operation pressure provided for the individual circuit elements. The individual circuit elements of each hermetically sealed circuit assembly are suspended in columns in the stack of hermetically sealed compression bonded circuit assemblies by individual deformable spacers which are located in the individual columns containing the compression bonded circuit elements between each of the circuit assemblies. The deformed spacers, which may be springs or shims depending upon the application conditions regarding generated heat, have first and second opposed surfaces with the first surface of each of the spacers facing an outside surface of a wall of a hermetically sealed chamber of the circuit assembly and a second surface which is located in a plane parallel to the opposed parallel walls of the chamber. This relationship insures that the individual circuit assemblies within the stack have uniform thickness at each of the points of contact within the columns of compression bonded circuit elements within the stack with adjacent circuit assemblies that produces uniform pressure on each of the compression bonded circuit elements within the column in the stack upon clamping to maintain the compression bonded circuit elements within the pressure specification of operation for the circuit elements. Furthermore, if the inelastically deformed spacers are chosen to be springs, the springs are chosen to have a spring rate which, during thermal cycling of operation of the circuit element, maintains pressure on the compression bonded circuit elements within the range of pressure specified for operation of the compression bonded circuit elements.

The preferred method of deforming the deformable spacers is to position the individual compression bonded circuit assembly on a flat surface with the spacers disposed outside and facing a wall of a hermetically sealed chamber containing the one or more individual circuit elements to be compression bonded and compressing the individual spacers past their yield point with a surface which is parallel to the surface on which the circuit assembly is resting to cause the surface of the spacers to lie within a plane which is parallel to the walls of the chamber of the hermetically sealed circuit assembly to eliminate any substantial variation in thickness of the columns measured between the deformed spacer within the column and one of the walls of the chamber opposite the wall facing the deformed spacer.

The opposed walls of the chamber of the hermetically sealed circuit assembly are provided with opposed pairs of annular corrugations defining columns within which circuit elements to be compression bonded are positioned that permit each of the individual circuit elements to be compression bonded to move in any direction without applying torsional or other loads to any other of the compression bonded circuit elements which would vary the pressure applied to the any other of the compression bonded circuit elements at least to an extent to vary pressure applied to the any other compression bonded circuit elements outside a desired range of pressure operation of the compression bonded circuit elements. This configuration permits each of the compression bonded circuit elements to "float" within the columns of the circuit assembly which insures that each of the compression bonded circuit elements may be maintained within its specified pressure range of operation. Furthermore, each of the circuit buses located within the individual hermetically sealed circuit assemblies contains at least one corrugation located between connections between the outside of the hermetically sealed circuit and an adjacent compression bonded circuit element which is in electrical contact with the circuit bus and at least one corrugation located between any compression bonded circuit elements which are in electrical connection with the circuit bus.

The corrugations of the circuit buses which connect individual compression bonded circuit elements and which further connect compression bonded circuit elements with circuit connections to the exterior of the hermetically sealed chamber prevent substantial torsional or other loads from being applied from one of the compression bonded circuit elements in one column to another of the compression bonded circuit elements in another column which would significantly vary the pressure applied to the adjacent compression bonded circuit elements at least to an extent to vary pressure applied to the any other compression bonded circuit element outside a desired range of pressure operation. These corrugations further enhance the "floating" of the individual compression bonded circuit elements within the column to maintain operating pressure within the range of operating pressure specified for the individual compression bonded circuit elements.

If individual deformed spacers, which are located within the columns of stacked compression bonded circuit elements within the stack of individually hermetically sealed circuit assemblies are chosen to be springs because of thermal expansion during operation in the application of the circuit, each spring is chosen to have a spring rate as a function of a specified operating pressure of the compression bonded circuit element which is located in the column containing the spring. The spring rate of each spring is chosen to maintain a pressure on the compression bonded circuit element that the spring is in axial alignment to be within the specified operating range of pressure of the circuit element during operation induced thermal cycling of the hermetically sealed circuit assembly.

Preferably, a heat exchanger is connected to and in thermal contact with an outside surface of a wall of the chamber of the hermetically sealed circuit to control thermal cycling of the individual compression bonded circuit elements within the chamber. The heat exchanger has first and second surfaces which are parallel to the first and second walls of the chamber. Preferably, the aforementioned spacers are deformed with the heat exchanger in contact with the wall of the chamber to insure that the plane containing the surfaces of the deformed spacers is parallel to the outside surfaces of the heat exchanger and the walls of the chamber. The heat exchanger may optionally be provided with passages for a cooling fluid to further control the temperature range of the compression bonded circuit elements during operation. If the heat exchanger effectively controls the cycling of operating temperature of the individual compression bonded circuit elements during operation, deformed shims may be used in place of the deformed springs for the reason that thermal expansion will be minimized to eliminate the necessity of compensating for thermal expansion of the individual compression bonded circuit elements within the columns of the stack of compression bonded circuit elements which could cause variation in operating pressure outside the specified pressure range for operation.

The spring in each column may alternatively be implemented by being distributed in one or more additional elements within each column of a hermetically sealed circuit assembly either within and/or outside a hermetically sealed chamber containing the circuit elements to be compression bonded. For example, both a deformed spacer and the heat exchanger may contribute part of the spring function. Furthermore, one or more additional elements within the chamber may contribute part of or all of the spring function.

When a plurality of circuit assemblies are stacked together, it is not necessary that each individual circuit assembly be identical. Furthermore, while an identical number of columns should be present in the stack of circuit assemblies to insure loading of the individual compression bonded circuit elements within the columns, a spacer, which does not perform a circuit function, may be located in one or more columns within the hermetically sealed chamber having a thickness similar to the thickness of the columns inside the chamber having compression bonded circuit elements to permit individual circuit assemblies having different numbers of compression bonded circuit elements to be placed in the stack.

A method for manufacturing a semiconductor device having a plurality of hermetically sealed compression bonded circuit assemblies disposed in a stack which are clamped together to compression bond circuit elements within the individual circuit assemblies includes forming a plurality of hermetically sealed circuit assemblies to be clamped together in the semiconductor device with each circuit assembly containing a plurality of circuit elements to be compression bonded disposed in columns to which is applied a force when the circuit assemblies are clamped together in the stack and having first and second opposed walls; positioning the first wall of each of the plurality of hermetically sealed circuit assemblies in a fixed position with respect to a first flat surface; positioning a separate spring in axial alignment with each of the circuit elements to be compression bonded outside of the circuit assembly containing the circuit element to be compression bonded for each of the circuit assemblies of the stack; inelastically deforming the springs of each circuit assembly by application of a compressive force by a second flat surface parallel to the first flat surface to deform the springs of the circuit assembly with a surface of each of the springs after deformation being disposed within a plane which is parallel to the opposed first and second walls of the circuit assembly, each inelastically deformed spring having a spring rate within a range which is a function of the circuit element that the spring is in axial alignment; positioning the circuit assemblies including springs which have been deformed in the stack; and clamping the stack of circuit assemblies to apply a compressive force through top and bottom surfaces of the stack to compression bond each of the circuit elements of each of the circuit assemblies of the stack with a pressure within a pressure range that the compression bonded circuit elements are to be operated. The spring rate is such that thermal expansion of the circuit assemblies during operation does not cause a combined pressure applied to each of the compression bonded circuit elements by the clamping force and by thermally caused expansion to fall outside a specified pressure range for operation of the compression bonded circuit elements. Each of the circuit assemblies of the stack may be identical. For circuit assemblies containing two or more different circuit elements to be compression bonded the spring for each of the different circuit elements to be compression bonded is chosen to have a spring rate upon deformation in accordance with a specified pressure rating at which different circuit elements to be compression bonded are to be operated. Each circuit assembly is preferably connected to and in thermal contact with a heat sink at the time of deformation. The heat sink may be chosen to apply a part of or all of the spring function of the individual columns. The stacked circuit assemblies are clamped together with each circuit assembly being connected to the heat sink to which each circuit assembly was connected when deformation occurred. Each heat sink has opposed surfaces which, except for a circuit assembly disposed at a bottom of the stack, respectively face two circuit assemblies when the stack of circuit assemblies is clamped together. The springs may be chosen from any material having the properties of inelastic deformation under load and a spring rate to apply pressure within the specified pressure range at which the individual stacked compression bonded circuit elements are to be operated with the force which causes the inelastic deformation being higher than the force applied to the springs during operation of the compression bonded circuit elements. The springs may be comprises of concentric rings each having a C-shaped cross section with opposite ends of the C being inelastically deformable toward each other. Alternatively, the springs may be comprised of a lattice having open cells defining columns intersecting the opposed walls of the hermetically sealed chamber.

A method for manufacturing a hermetically sealed compression bonded circuit assembly having a plurality of circuit elements to be compression bonded in accordance with the invention comprises forming a hermetically sealed circuit assembly containing a plurality of circuit elements to be compression bonded disposed in a spatial pattern having first and second opposed walls; positioning the first wall of the hermetically sealed circuit in a fixed position with respect to a first flat surface; positioning a separate spring in axial alignment with each of the circuit elements to be compression bonded outside of the circuit assembly; and inelastically deforming the springs of the circuit assembly by application of a compressive force by a second flat surface parallel to the first flat surface to deform the circuit assembly with a surface of each of the springs after deformation being disposed within a plane which is parallel to the opposed surfaces of the circuit assembly, each inelastically deformed spring having a spring rate within a range which is a function of the circuit element in which the spring is in axial alignment. Furthermore, in accordance with the method the deformed springs are attached to the circuit assembly at a position identical to the position of the springs at which deformation took place.

A method for manufacturing a semiconductor device having a plurality of hermetically sealed compression bonded circuit assemblies disposed in a stack which are clamped together to compression bond circuit elements within the individual circuit assemblies in accordance with the invention includes forming a plurality of hermetically sealed circuit assemblies to be clamped together to form the semiconductor device with each circuit assembly containing a plurality of circuit elements to be compression bonded disposed in columns to which is applied a force when the circuit assemblies are clamped together in the stack and having first and second opposed walls; positioning the first walls of each of the plurality of hermetically sealed circuit assemblies in a fixed position with respect to a first flat surface; positioning a separate deformable shim in axial alignment with each of the circuit elements to be compression bonded outside of the circuit assembly containing the circuit element to be compression bonded for each of the circuit assemblies of the stack; inelastically deforming the deformable shims of each circuit assembly by application of a compressive force by a second flat surface parallel to the first flat surface to deform the shims of the circuit assembly with a surface of each shim after deformation being disposed within a plane which is parallel to the opposed first and second walls of the circuit assemblies; positioning the formed circuit assemblies including deformed shims which have been deformed in the stack; and clamping the stack of circuit assemblies to apply a compressive force through top and bottom surfaces of the stack to compression bond each of the circuit elements of each of the circuit assemblies of the stack with a pressure within a pressure range that the compression bonded circuit elements are to be operated. Each of the circuit assemblies of the stack may be identical. Each circuit assembly may contain at least two different circuit elements to be compression bonded. Each circuit assembly may be connected to and in thermal contact with a heat sink at the time of deformation. The stacked circuit assemblies are clamped together with each circuit assembly being connected to the heat sink to which each circuit assembly was connected when deformation occurred. Each heat sink has opposed surfaces which except for a circuit assembly at a bottom of the stack respectively face two circuit assemblies when the stack of circuit assemblies is clamped together. The shims may be a molded resin in accordance AMS 3726-1-2-3.

A method for manufacturing a hermetically sealed circuit assembly having a plurality of circuit elements to be compression bonded in accordance with the invention includes forming a hermetically sealed circuit assembly containing a plurality of circuit elements to be compression bonded, and having first and second opposed walls; positioning the first wall of the hermetically sealed circuit assembly in a fixed position with respect to a first flat surface; positioning a separate deformable shim in axial alignment with each of the circuit elements to be compression bonded outside of the circuit assembly; and inelastically deforming the deformable shims of the circuit by application of a compressive force by a second flat surface parallel to the first flat surface to deform the circuit assembly with a surface of each of the shims after deformation being disposed within a plane which is parallel to the opposed surfaces of the circuit assembly. Further in accordance with the method, the deformed shims are attached to the circuit assembly at a position identical to the position of the shims at which deformation took place.

As used herein the terminology "parallel" or "substantially parallel" in describing the relationship of opposed surfaces of deformed shims, deformed springs and deformed spacers means a spatial relationship of opposed surfaces which is achieved by moving of two parallel surfaces toward each other to load the shims, springs or deformable spacers, with a load causing inelastic deformation of the shims, springs or spacers in a direction parallel to the applied force.

Furthermore, the terminology "parallel" or "substantially parallel" in describing the relationship of opposed surfaces of a heat sink or walls of a chamber means the surfaces are as close to being perfectly parallel as necessary to achieve operation of compression bonded circuit elements within circuit assemblies in accordance with a range of pressures at which the circuit elements are specified to operate.

As used herein the terminology "deformed" in describing a shim, spacer or spring means a shim, spacer or spring to which has been applied a force which inelastically reduced a dimension of the shim, spacer or spring parallel in the direction of the applied force which force is greater in magnitude than a force applied to compression bond circuit elements in circuit assemblies containing the shim, spacer or spring.

BRIEF DESCRIPTION OF THE DRAWINGS

FIG. 9 is a sectional view of FIG. 8 along section line 9—9.

FIG. 10 is a sectional view of FIG. 8 along section line 10—10.

BEST MODE FOR CARRYING OUT THE INVENTION

Figure 1:
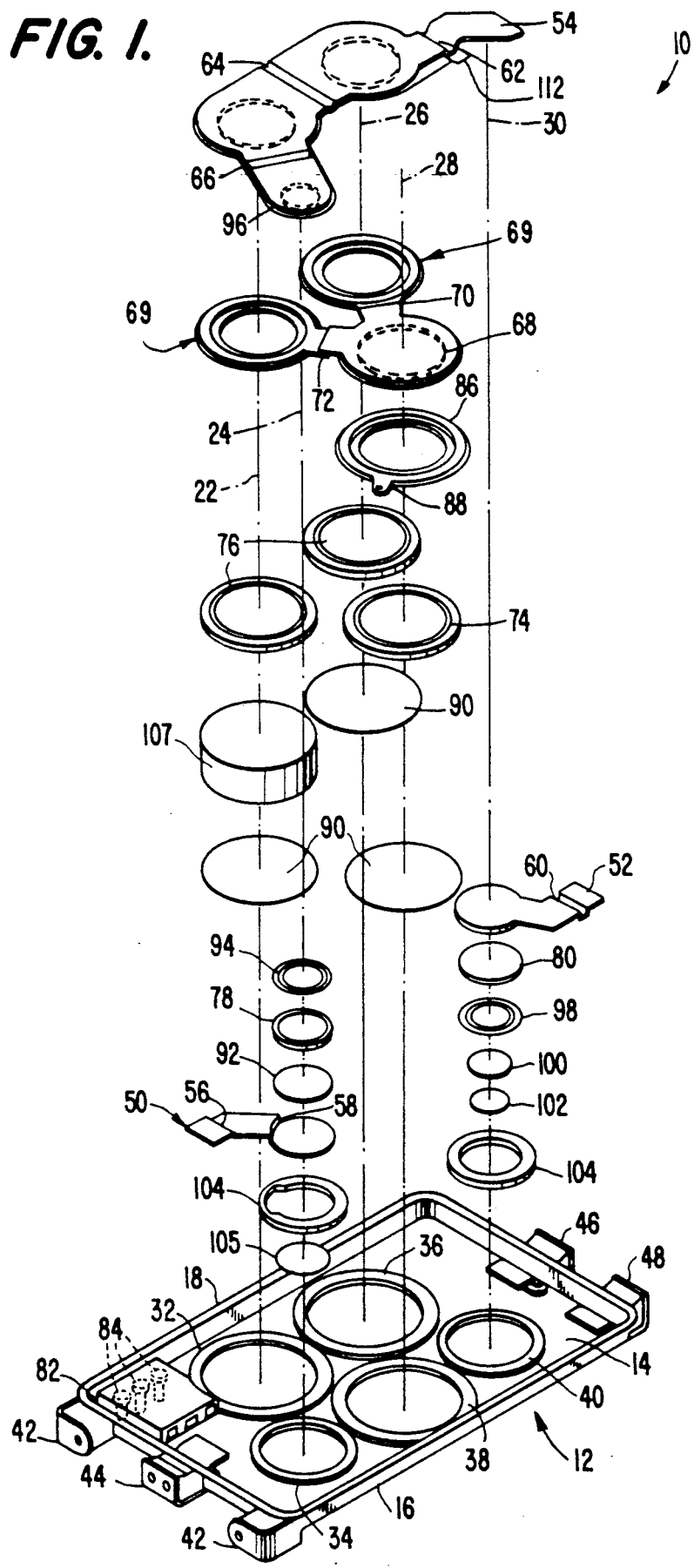
FIGS. 1-3 illustrate an exploded view of an individual hermetically sealed circuit assembly in accordance with the invention.
Figure 2:
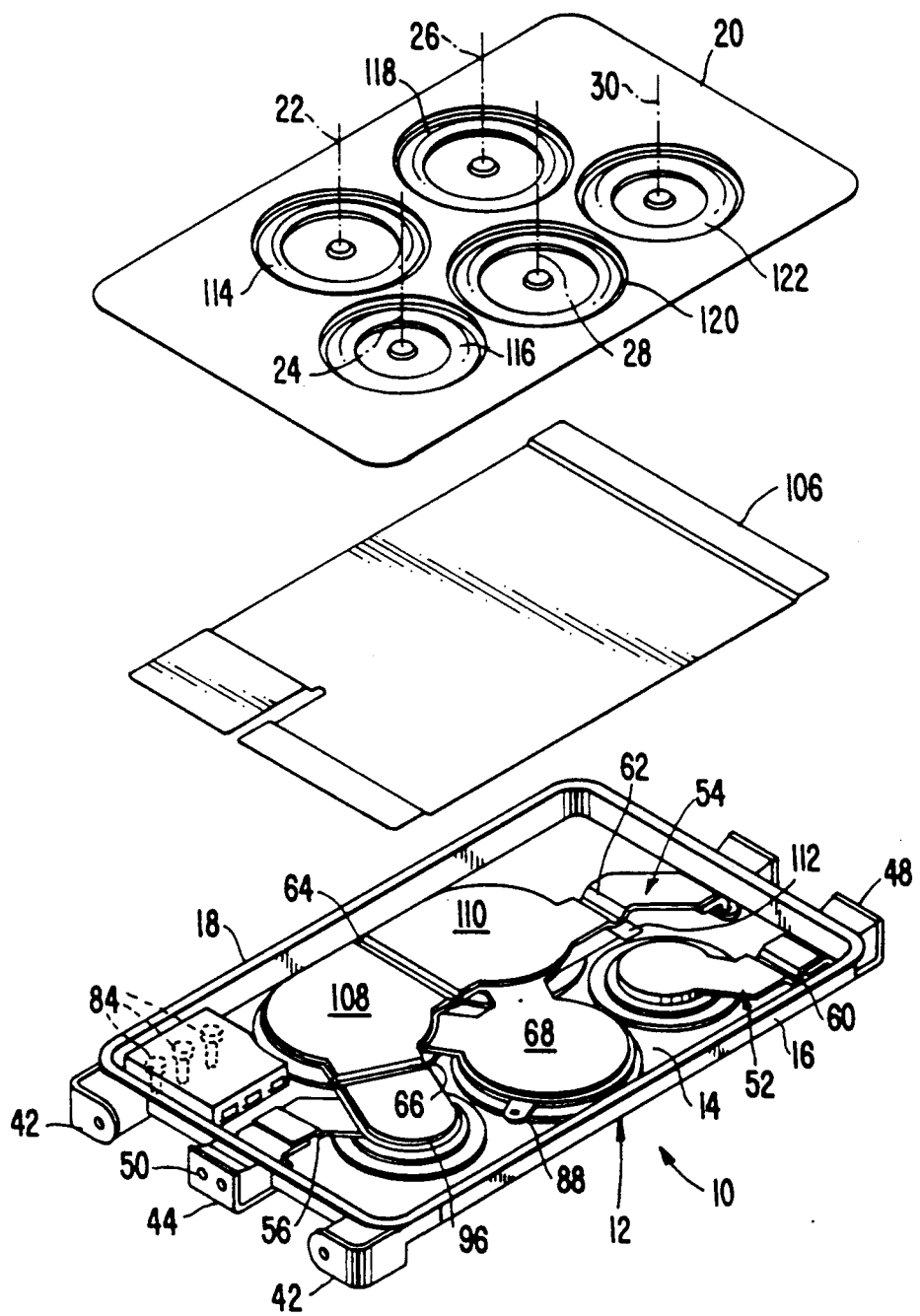
Figure 3:
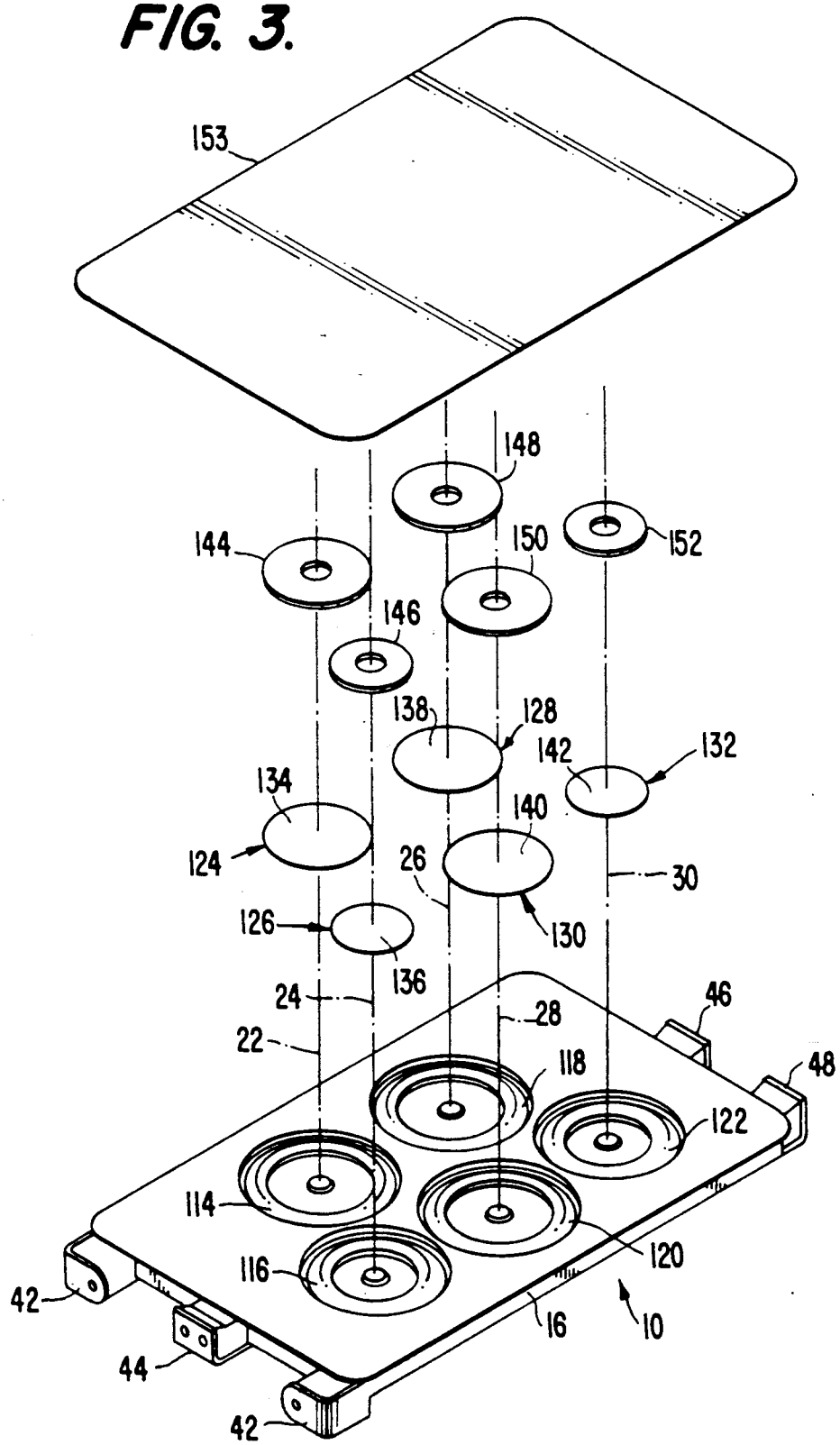

FIGS. 1-3 illustrate an exploded view of a single hermetically sealed hybrid circuit assembly 10 in accordance with the invention. Like reference numerals identify like parts in FIGS. 1-14. As will be described below with reference to FIG. 14, the preferred application of the individual hermetically sealed hybrid circuit assembly 10 of FIGS. 1-3 is in a stack containing at least one circuit assembly with each circuit assembly having a plurality of circuit elements to be compression bonded. The circuit elements to be compression bonded are individually located in separate columns within the stack. A clamp applies force to the stack to apply pressure within a specified range of operation of each of the circuit elements to be compression bonded contained in each of the circuit assemblies. It should be understood that the columns discussed below with reference to the individual circuit assemblies 10 are in identical axial locations as the axial locations of the columns discussed with reference to the stack of individual circuit assemblies in FIG. 14. Metallic pan 12 has a flat section 14 and a closed wall 16 which projects upward from the flat section. The wall 16 contains a lip 18 which is joined by a process such as cold welding to a lid 20 to form a hermetically sealed chamber disposed between the flat section 14 and the lid 20. A plurality of columns 22-30 are contained in each circuit assembly in which circuit elements to be compression bonded are located as described below. The flat section 14 contains circular corrugations 32-40 which are respectively concentric to the axis of the columns 22-30 and which project outward into the chamber. It should be understood that each of the corrugations 32-40 may be comprised of one or more concentric annular rings which are formed in the metal of the flat section 14 by conventional processing such as stamping. The corrugations 32-40 are provided in the flat section 14 to permit freedom of movement of the portion of the flat section 14 at least within the columns 22-30 in any direction without transmitting substantial torque or loads (cantilevered) from one of the compression bonded circuit elements to any other of the compression bonded circuit elements which substantially affects pressure applied to the any other compression bonded circuit elements at least to an extent to vary pressure applied to the any other compression bonded circuit elements outside a desired pressure range of operation. Preventing transmission of substantial torque or loads is an important part of the present invention maintaining pressure on individual circuit elements within the range of pressure for operation specified for the individual circuit elements to be compression bonded. The corrugations 32-40 are further useful for defining the location of the columns 22-30 to permit the components within each of the columns to be easily located therein. A pair of identical circuit connections 42 connect the pan 12 to external circuits (not illustrated). As illustrated, the circuit connections 42 are connected to the collectors of transistors to be compression bonded which are contained within the hermetically sealed chamber defined by the flat section 14, wall 16 and the lid 20. Bus connections 44, 46 and 48 respectively connect the diode bus 50, diode bus 52 and emitter bus 54 with the exterior of the chamber defined by the flat section 14, wall 16 and lid 20.

Each of the circuit buses 50, 52, and 54 contains at least one corrugation which is disposed between a point of electrical contact with a circuit bus connector and a point of electrical contact with a circuit element to be compression bonded and one or more additional corrugations as, for example 64, in each circuit bus disposed between any circuit elements to be compression bonded which are in electrical contact with the circuit bus. The corrugations permit the circuit bus to freely flex in between rigid points of contact which are with the circuit bus connections 44-48 and with the individual circuit elements to be compression bonded and with any circuit elements to be compression bonded which are connected by a circuit bus. The corrugations prevent the application of torque or loading between the circuit bus connections and circuit elements to be compression bonded or between circuit elements to be compression bonded which are electrically connected to the circuit bus at least to an extent that varies pressure applied to the compression bonded circuit elements outside a desired pressure range of operation. Specifically, the diode bus 50 contains corrugations 56 and 58; the diode bus 52 contains corrugation 60; emitter bus 54 contains corrugations 62, 64 and 66 and Darlington bus 68 contains corrugations 70 and 72 to the base contacts 69 for transistors 76.

It should be understood that the present invention is not limited to the particular circuit configuration illustrated in FIGS. 1-4 with the circuit elements to be compression bonded in the chamber defined by the flat section 14, wall 16 and lid 20 being described as follows. A bipolar driver transistor 74 is an input to a pair of matched bipolar driven transistors 76 which are connected to the driver transistor in a conventional Darlington configuration. Furthermore, diodes 78 and 80 are circuit elements to be compression bonded. A control circuit 82, which may be any conventional integrated circuit or other circuit which is not to be compression bonded, is provided in an area of the flat section 14 where compressive force is not applied. The control circuit may perform the function of a Baker clamp. It should be understood that the control circuit 82 may perform any control function which is desired to be utilized with the circuit elements to be compression bonded. Electrical connections between the control contacts 84 and the exterior of the circuit have been omitted for purposes of clarity. Similarly, electrical connections in the interior of the chamber between the output of the control circuit 82 and the various compression bonded circuit elements have been omitted. The omitted electrical connections may be determined from FIG. 4. For example, base contact 86, which is electrically connected to the base of the driver transistor 74, is connected to the control circuit 82 by a flex circuit (not illustrated) spanning the displacement between contact point 88 and the control circuit. Each of the collectors of bipolar transistors 74–76 are respectively electrically connected to an interior surface of the flat section 14 within the circular area defined by circular corrugations 32, 36 and 38 by means of a soft metal foil 90. The soft metal foil 90 insures that upon application of the compressive force by a clamp to a stack of hermetically sealed circuit assemblies 10 that there will be complete thermal and electrical contact between the collectors of the bipolar transistors 74–76, the flat section 14, and the circuit connections 42, and thermal conduction from the circuit assembly if a heat sink is connected to an outside surface of the flat section 14 as described below with reference to 13. Soft metal disk 92 provides full electrical and thermal contact between the diode 78 and diode bus 50. Soft metal foil disk 94 provides complete electrical contact between the diode 78 and the end portion 96 of emitter bus 54. Soft metal foil disk 98 provides complete electrical and thermal contact between diode 80 and spacer 100 Soft metal foil disk 102 provides thermal and electrical contact with the annular recess defined by circular corrugation 40. A pair of annular insulative spacers 104 are provided. A ceramic disk spacer 105 providing electrical insulation and thermal conductivity is disposed between diode bus 50 and the flat section 14 in the annular recess defined by circular corrugation 34. The bushing 105 may be metallized to improve thermal contact.

Furthermore, it should be understood that the invention is not limited to having a compression bonded circuit element disposed in each of the columns 22–30. An insulative spacer 107 may be disposed in one or more of the columns within the hermetically sealed chamber of a circuit assembly which are not performing a circuit function to permit individual circuit assemblies 10 having differing numbers of compression bonded circuit elements to be compression bonded in a single stack. For example, the insulative spacer 107 having a thickness similar to the combined thickness of the elements in columns 24–30 within the hermetically sealed chamber could be inserted in the column 22 to provide a conventional Darlington amplifier with only a single output stage.

FIG. 2 illustrates an exploded view comprised of the circuit assembly 10 consisting of the components discussed above with reference to FIG. 1, insulating sheet 106, and the lid 20. The insulating sheet 106 is provided to electrically isolate the exposed top portions of the diode bus 50, diode bus 52, emitter bus 54 and the Darlington bus 68 from the lid 20. As illustrated, the diode bus 50 is disposed beneath the end portion 96 of the emitter bus 54; the Darlington bus base contacts 69 is disposed below intermediate portions 108 and 110 of the emitter bus 54. Furthermore, insulator 112 electrically isolates the bottom surface cf the emitter bus 54 from base contacts 69 of the Darlington bus 68. Circular corrugations 114–122 are provided in the lid 20 which are respectively concentric with columns 22–30 so that the corrugations respectively are disposed above and axially aligned in opposed pairs with the corrugations 32–40. Each of the circular corrugations 114–122 forms a recess which projects inward toward the hermetically sealed chamber which is formed by joining the closed wall 16 of pan 12 to the lid 20. Opposed pairs of the corrugations 32–40 and 114–122 are each disposed in a separate column 22–30. The corrugations 114–122 perform two functions which are to axially locate the deformable spacers 124–132, discussed below with reference to FIG. 3, and to permit the portion of the lid 20 within the columns 22–30 to flex in an direction without transmitting substantial torque or loads (cantilevered) from one of the circuit elements to be compression bonded to another of the circuit elements to be compression bonded which substantially affects pressure applied to any other compression bonded circuit elements at least to an extent that varies pressure applied to the compression bonded circuit elements outside a desired pressure range of operation. It should be understood that each of the corrugations 114–122 may be comprised of one or more concentric annular rings which are formed in the metal of the lid 20 by conventional processing such as stamping. The annular recess formed by each of the circular corrugations 114–122 receives a deformable spacer which may be a spring or shim as discussed below with reference to FIGS. 3 and 13. The lip 18 is joined to the lid 20 by a process such as cold welding or brazing to form a hermetic seal defining the chamber having opposed parallel walls which respectively are the flat section 14 and the lid 20.

Figure 13:
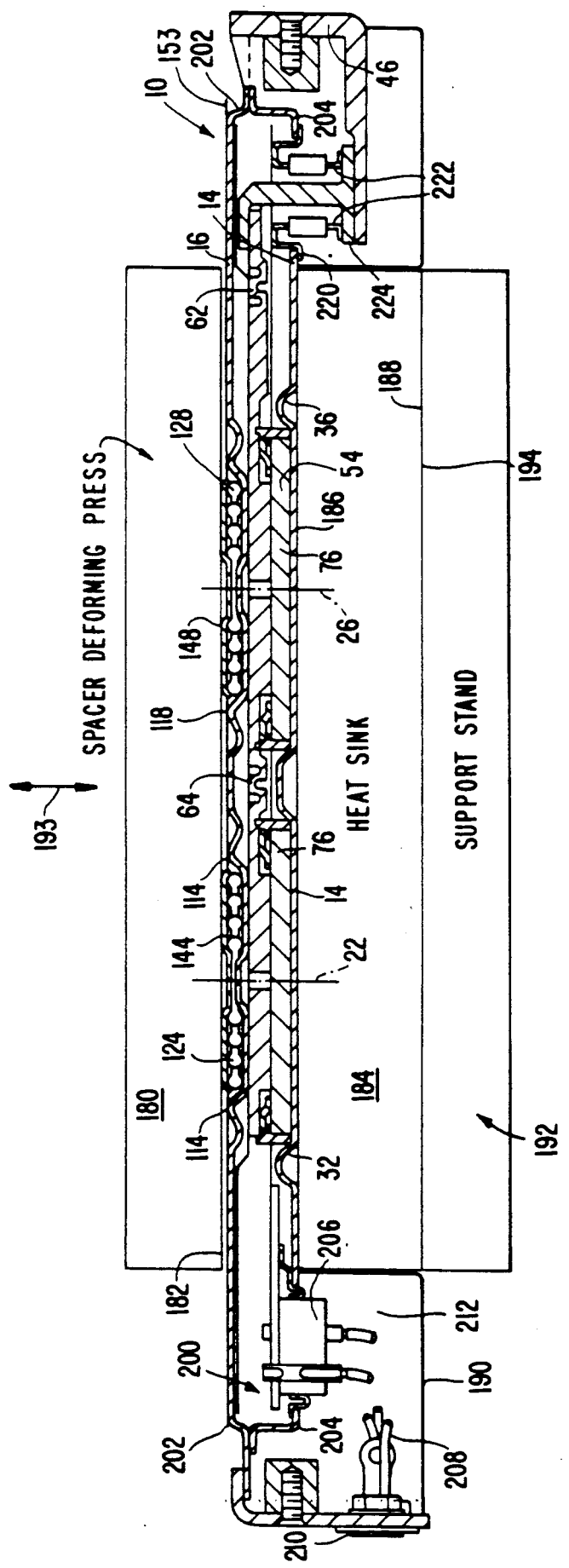
FIG. 13 illustrates the process for deforming the deformable spacers of the present invention.
Figure 14:
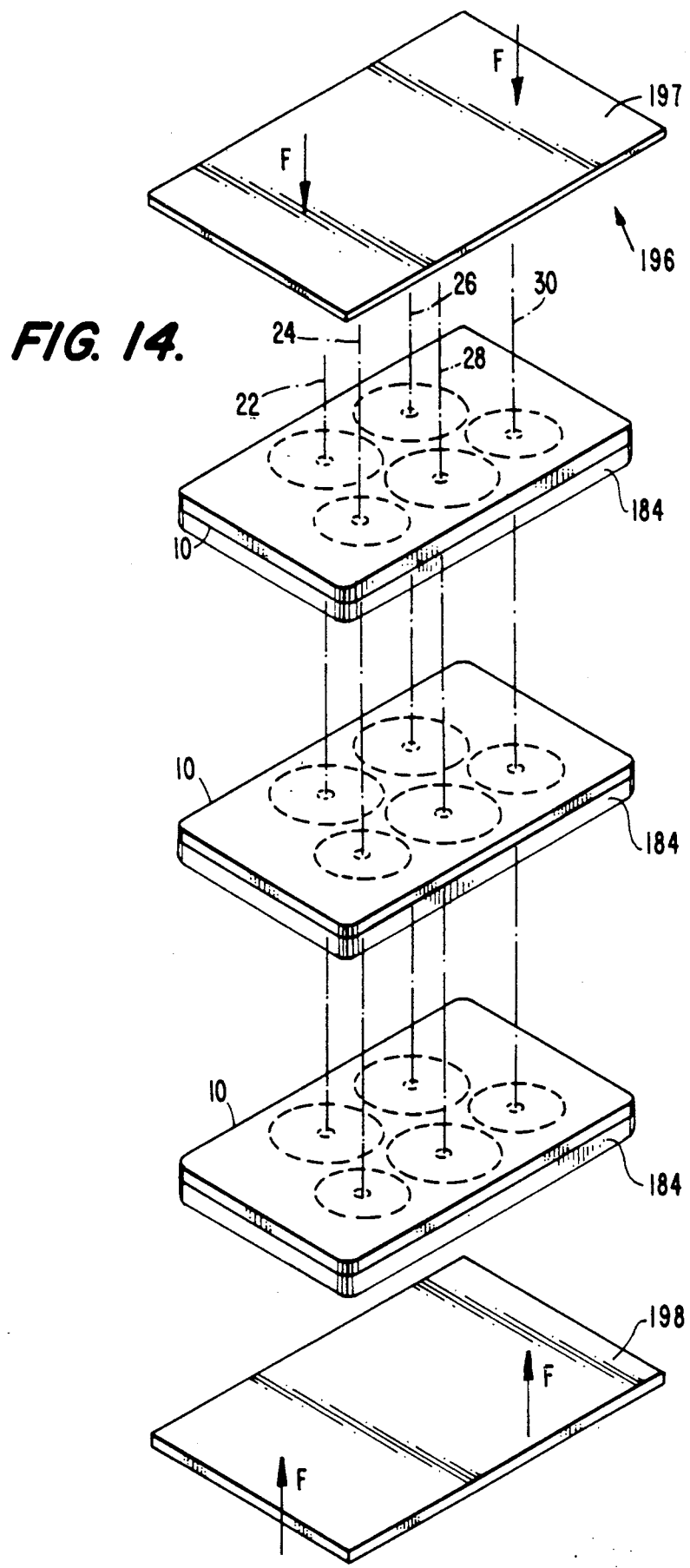
FIG. 14 illustrates a compression bonded stack of circuits in accordance with the invention.

FIG. 3 illustrates an exploded view of the assembled components of FIG. 2 and deformable spacers 124–132 and load washers 144–152 which are contained in the columns 22–30. Load washers 144–152 and deformable spacers 124–132 are held in place by insulator sheet 153 which is bonded to lid 20 of assembly 10. The deformable spacers 124–132 are respectively disposed in the columns 22–30 and function to suspend the individual circuit assemblies 10 and heat sink assembly 184 in a stack as illustrated in FIG. 14 so that the plane defined by the surfaces of the deformable spacers facing away from the lid 20 is the point of contact with adjacent circuit assemblies 10 and heat sink assembly 184 or the clamp holding the circuit assemblies in a stack of compression bonded circuit assemblies 10. As will be described in detail below with regard to FIGS. 5–7, each of the spacers may be either a deformable shim or a deformable spring. The deformable spacers 124–132 are each deformed (within the columns 22–30) by a process described below with reference to FIG. 13 to provide the circuit assembly 10 with a uniform thickness measured between the surfaces 134–142 of the deformable spacers 124–132 and the outside surface of the flat surface 14 within the columns 22–30 and further with a uniform thickness measured between the aforementioned surfaces of the spacers and an outside surface of a heat sink (illustrated in FIG. 13) within the columns 22-30. Load washers 144-152 are respectively disposed above deformable spacers 124-132 Within columns 22-30 for distributing clamping force applied to a stack of at least one circuit assembly 10 as described with reference to FIG. 14. When the deformable spacers 124-132 have been deformed in accordance with the process described below with reference to FIG. 13, the top surfaces 134-142 are disposed within a single plane which is parallel to the flat regions within the flat surface 14, the flat regions within the lid 20 and the opposed surfaces of the heat sink as described below with reference to FIG. 13. The load washers 144-152 function to uniformly distribute clamping force to the deformable spacers 134-140 which is transferred through the columns 22-30 to the individual circuit elements to be compression bonded. An insulating sheet 153 is provided on top of the load washers 144-152 to electrically isolate the individual circuit assemblies 10 when they are configured in a stack of circuit assemblies as discussed below with, reference to FIG. 14 and retains deformable spacers 124-132 and load washers 144-152 to assembly 10 by adhesive to lid 20.

Figure 4:
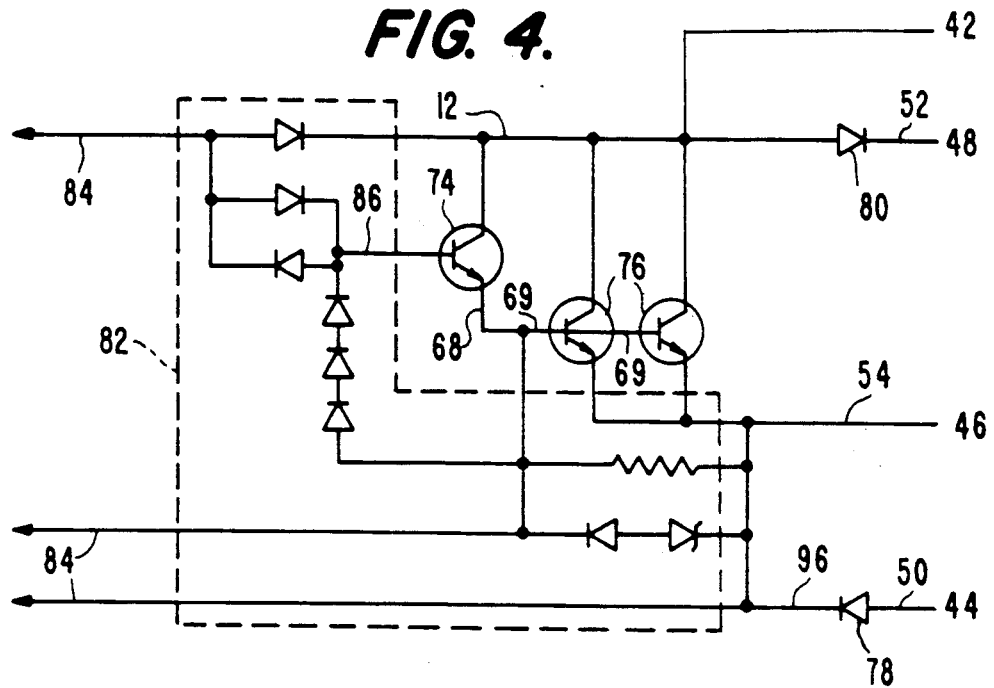
FIG. 4 is a circuit schematic of the circuit illustrated in FIG. 2.

FIG. 4 illustrates an electrical schematic of the circuit illustrated in FIGS. 1 and 2. As stated above, it should be understood that the present invention is not limited to the particular circuit disclosed herein and is applicable to circuits requiring one or more compression bonded circuit elements which are to be hermetically sealed and stacked in a stack of multiple circuits. Moreover, while the control circuit 82, which is delineated by the dotted lines, is illustrated as a Baker clamp, it should be understood that other control circuitry may be disposed therein which in the present embodiment is external to the circuit assembly 10. The circuit of FIGS. 1-4 may be used in an inverter for generating AC Power in an airframe. Furthermore, the electrical connections in the interior of the chamber which have been omitted from FIG. 3 may be determined from FIG. 4. The precise layout of the electrical connections which have been omitted from FIG. 3 is not critical and required connections should not be short circuited together within the hermetically sealed chamber.

Figure 5:
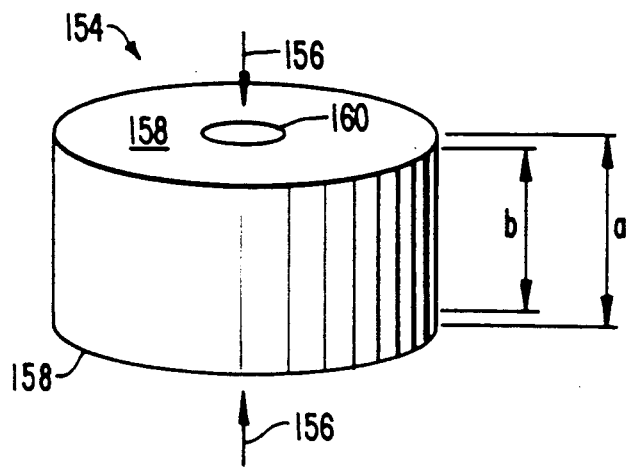
FIG. 5 is a perspective view of a deformable shim in accordance with the invention.

FIG. 5 illustrates a deformable spacer 154 which is comprised of an annular section of molded resin which may be deformed by the uniform application of force vectors 156 to opposed faces 158. The force vectors 156 are the force applied by the process described below with reference to FIG. 13 by a press of conventional design. The width of the molded resin 154, as measured across the opposed faces 158, is compressed inelastically from dimension "a" to dimension "b" upon the application of compressive force above the elastic limit of the molded resin as described below in FIG. 13 with reference to the manufacturing process of deforming the deformable spacers 124-132 of the present invention. The annulus 160 functions to center the spacer 154 on the axis of the circular corrugations 114-122 and in columns 22-30. Each corrugation, as illustrated in FIG. 2, has a center raised portion which engages the opening to the annulus on the side facing the lid 20. The moldable material may be in accordance with AMS 3726-1-2-3. Alternatively, nondeformable members can be machined while under compressive load to result in the uniform thickness referred to above.

Figure 6:
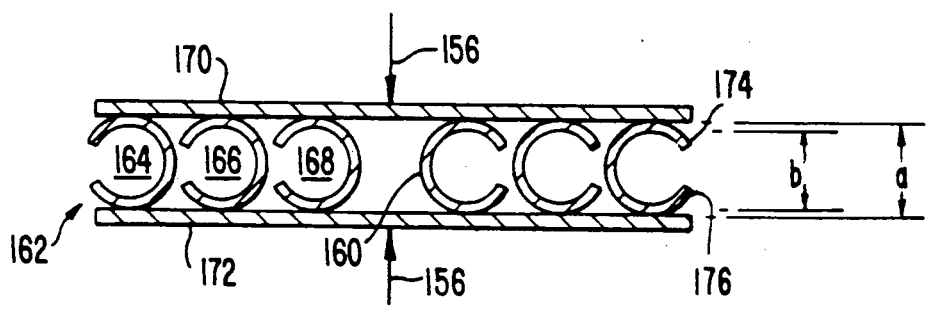
FIG. 6 is a cross-sectional view of a first form of deformable spring in accordance with the present invention.

FIG. 6 illustrates a sectional view of a deformable spring set 162 which is usable as the deformable spacers 124-132. The deformable spring set 162 has a characteristic which permits it to be inelastically deformed while retaining a spring rate for maintaining the pressure applied to individual circuit elements to be compression bonded within the columns 22-30 within the range of pressure to be applied during operation as a consequence of dimensional expansion caused by thermal cycling. The deformable spring set 162 is comprised of one or more annular rings made from a conventional "C"-seal which rings are concentric to the axes of the columns 22-30 when positioned as in FIG. 3. The deformable spring 162, as illustrated, has three concentrically disposed rings 164-168. Alternatively, although not illustrated, the deformable spring set 162 may have the concentric rings joined together by a connector such as metal layers joined diametrically to the top and bottom parts of the individual concentric rings 164-168. The application of force vectors 156 to flat rigid surfaces 170 and 172 of a conventional press (not illustrated) inelastically compresses the cross section of the rings 164-168 past their yield point to reduce the dimension "a" to a dimension, such as "b", between the ends 174 and 176 of the concentric rings 164-168. The compression of the cross section of the concentric rings 164-168 is further described below regarding FIG. 13 with respect to the manufacturing process. The thickness, diameter of the "C", and number of concentric rings may be chosen to obtain the desired spring rate during thermal cycling within the operating pressure range of the compression bonded circuit element above which the spring is disposed.

Figure 7:
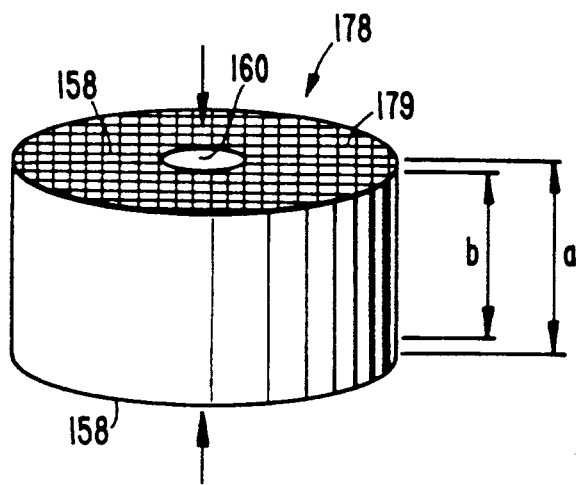
FIG. 7 is a perspective view of a second form of deformable spring in accordance with the present invention.
Figure 11:
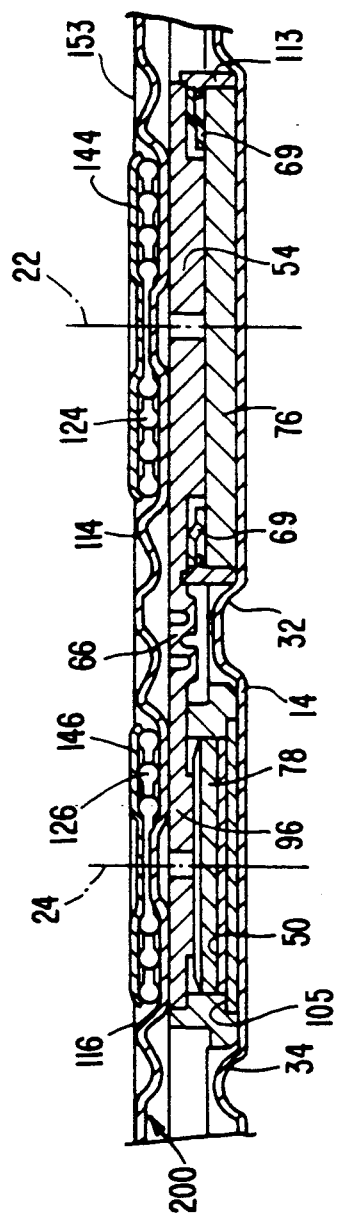
FIG. 11 is a sectional view of FIG. 8 along section line 11—11.
Figure 12:
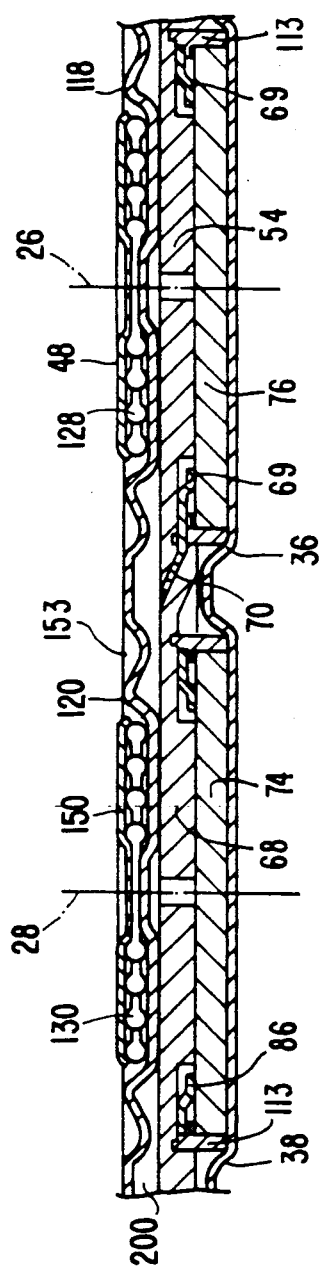
FIG. 12 is a sectional view of FIG. 8 along section line 12—12.

FIG. 7 illustrates a perspective view of a deformable spring 178 made from conventional lattice having axial columns extending between faces 158 including a plurality of cells 179 in an array. The axial columns intersect the recesses within the flat section 14 and the lid 20 with an angle which is preferably 90°. The number of cells 179 per unit area and geometric shape may be varied to obtain a desired spring rate to maintain pressure within a range of pressure required for particular circuit elements to be compression bonded. The lattice has the property of being inelastically deformable to reduce its dimension, in a direction parallel to the direction of the applied force, from "a" to "b" as is described with reference to FIG. 13 below regarding the manufacturing process while providing a spring rate which applies pressure during thermal cycling within the operating pressure range of the compression bonded circuit element above which the lattice is disposed.

The choice of utilization of the different types of deformable spacers 154, 162 and 178 is as follows. When the heat sink, which is described below with reference to FIG. 13, is effective in minimizing thermal expansion during operation, the molded resin 154 may be utilized which does not have a spring rate chosen to maintain the pressure on the compression bonded circuit elements within an operating pressure specified by the circuit elements. When the amount of thermal expansion is minimized by effective heat sinking, the dimensional change of the thickness of the individual deformable spacers 124-132 is so small that the pressure applied to the individual circuit elements within the columns 22-30 does not fall outside of the specified pressure range for operation which eliminates the requirement of having a desired spring constant. Alternatively, when the heat sink is not effective in reducing expansion caused by thermal cycling to a degree to maintain the desired pressure during operation without compensation for dimensional change, it is necessary to provide deformable springs or a distributed spring function in the columns 22-30 which will maintain pressure on the compression bonded individual elements within the columns within the specified compressive force of the particular circuit elements. The spring constant of the individual deformable springs is chosen to maintain the pressure on the circuit element within its column 22-20 within the pressure range specified for the circuit element. It should furthermore be understood that the foregoing examples of materials which may be utilized for the deformable springs are not limitations of the practicing of the invention. It should be understood that other materials exhibiting a spring function are usable in the practicing of the invention which are inelastically deformable in a direction parallel to the direction of an applied force in accordance with the process describe below with reference to FIG. 13 and further which exhibit a spring rate which will maintain pressure on compression bonded circuit elements within the columns 22-30 within the specified operating pressure range of the circuit elements during thermal cycling.

While in applications requiring a spring rate to compensate for thermal expansion during operation it is preferred to have the spring function produced by the deformable spacers 124-132, it should be understood alternatively that the spring function may be distributed within the columns 22-30 within one or more other elements which may be disposed within the hermetically sealed chamber or outside of the chamber. For example, the heat sink described below may alternatively contribute part or all of the described spring function. A spring rate in the heat sink may be produced as a consequence of the choice of material from which the heat sink is made and/or as a consequence of its geometry such as, but not limited to, providing spaced heat radiating structures which extend parallel to the axes of the columns 22-30.

Figure 8:
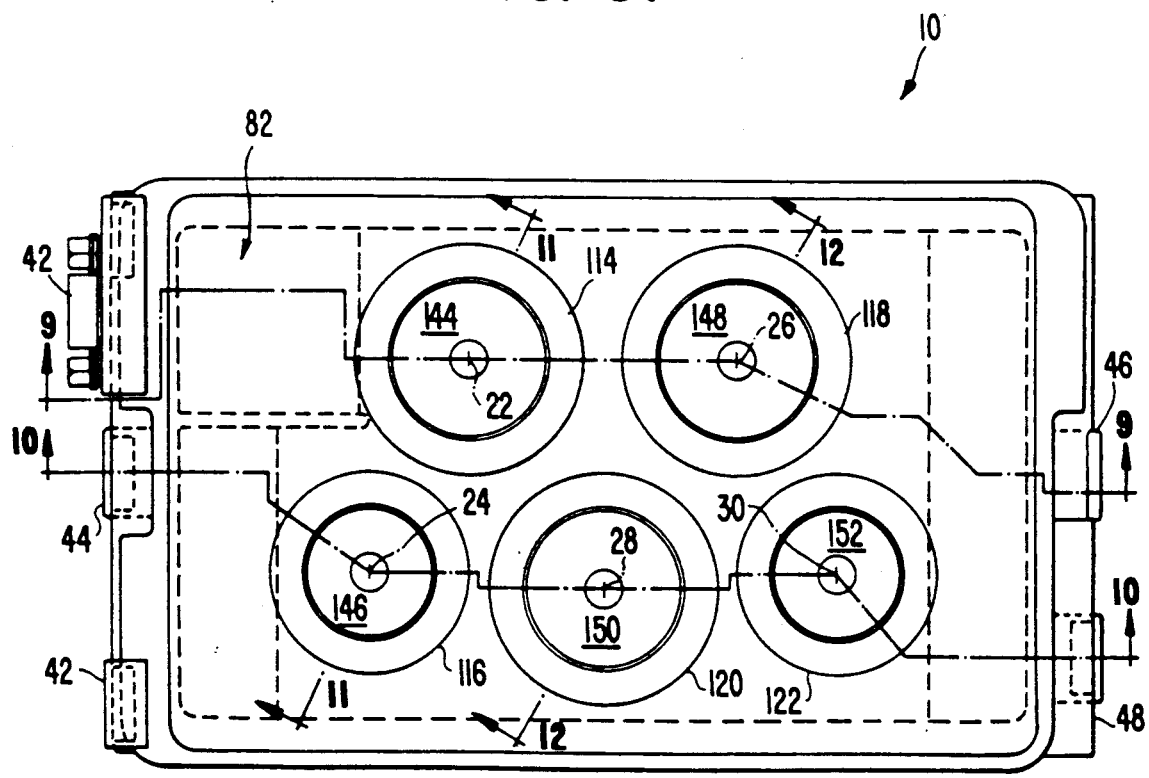
FIG. 8 is a top plan view of a hermetically sealed compression bonded circuit assembly in accordance with the present invention.

FIG. 8 illustrates a top plan view of a hermetically sealed circuit assembly 10 in accordance with the invention with the insulative layer 153 removed. FIGS. 9-12 illustrate sectional views of FIG. 8. Furthermore, while in FIGS. 9-12 the deformable spacers 124-132 are the C springs illustrated in FIG. 6, it should be understood that the deformable spacers 124-132 may be either the deformable shims or the deformable springs of FIGS. 5-7 or other materials having the above-described properties depending upon the application of the present invention as described above.

With reference to FIGS. 9 and 10, the chamber 200 has rounded corners 202 and 204 which are provided for strain relief caused by heat buildup by welding or brazing of the lid 20 to the flat section 14. A multiple pin ceramic feedthrough 206 with pins 84 permits wiring connections between the control circuit 82 within the hermetically sealed chamber 200 and the exterior by wires 208 which extend through connector 210. Potting 212, which may be any suitable resin which is thermally stable for the service conditions, is provided to protect and hold the connectors 42 and 210. A hermetically sealed feedthrough 214 permits connection of the emitter bus 54 to the exterior of the chamber by connection to the feed through bus 216 of the bus connector 46. Ceramic annulus 218 has metal connectors 220 which are joined to the flat section 14 and connectors 222 which are joined to the base 224 of the feedthrough 214. Potting 226, which may be any suitable resin which is thermally stable for the service condition, is provided to protect and hold the bus connector 46. Similarly, the feedthrough 214 connects diode bus 52 to bus connector 48 and diode bus 50 to bus connector 44.

The process for deforming the deformable spacers 124-132 in accordance with the present invention is described with reference to FIG. 13. As was described above with reference to FIG. 3, the top surfaces 134-142 of the deformable spacers 124-132 are inelastically deformed to be disposed within a single plane which is parallel to the flat portions of flat surface 14, the flat portions of lid 20 and opposed surfaces 186 and 188 of heat sink 184. Deformation of the deformable spacers 124-132 is produced by the combination of a spacer deforming press 180 which has a flat surface 182 which is moved orthogonal with respect to the flat portions of the assembled parallel flat surface 14 and lid 16. The orthogonal movement of the spacer deforming press 180, which is indicated by the bidirectional arrow 183, may be accomplished by any suitable mechanical translating mechanism which per se is not part of the present invention. In the preferred form of the invention, although not limited thereto, the heat sink 184 is attached to an outside surface of the flat surface 14 to form a thermal contact of high conductivity to permit heat generated by the compression bonded semiconductor elements in each of the circuit assemblies 10 to be effectively conducted to and dissipated by the heat sink. Furthermore, the heat sink may include suitable manifolds to receive cooling fluids or heat radiating fin structure (not illustrated) to increase the heat conducting properties of the heat sink 184 and provide the aforementioned spring characteristic.

The inside surface 186 and outside surface 188 of the heat sink 184 are parallel to the flat portions of the assembled flat surface 14 and lid 20, surface 194 of the support stand 192, and surface 182 of the spacer deforming press 180. Accordingly, lowering of the spacer deforming press 180 by the translating mechanism, as indicated by arrow 183, deforms the deformable spacers 124-132 so that the thickness of the circuit assembly in each of the columns 22-30 measured between the surfaces 134-142, within the columns 22-30 and the outside surface of the flat surface 14 or the surface 188 of the heat sink 184 is uniform and substantially identical. It is the objective of the process of deforming the spacers 124-132 to make the thickness of the columns measured across the outside of each circuit assembly 10 to be as close as is possible to being identical within the constraints of economically manufacturing the circuit assemblies.

Each of the deformable spacers 124-132 is deformed by the process described above with reference to FIG. 13 to a thickness which compensates for variation in thickness of like parts disposed in the columns 22-30, for variation in the number and thickness of circuit buses within the columns such as, for example, with reference to FIG. 2 wherein columns 22-26 each contain two circuit buses and columns 28 and 30 contain one circuit bus and for variation in the total number of elements in columns 24-30 as indicated below in Table I.

TABLE I

| Column | 22 | 24 | 26 | 28 | 30 |
|---|---|---|---|---|---|
| Identification of part by reference number | 54 | 54 | 54 | 68 | 52 |
| | | | | | 80 |
| | 76 | 94 | 76 | 74 | 98 |
| | 90 | 78 | 90 | 90 | 100 |
| | — | 92 | — | — | 102 |

TABLE I-continued

| Column | 22 | 24 | 26 | 28 | 30 |
|---|---|---|---|---|---|
|  |  | 105 |  |  |  |
| Total number of parts | 3 | 7 | 3 | 3 | 5 |

By deforming the deformable spacers 124-132 to a thickness to produce a uniform thickness measured across each of the columns 22-30 of the circuit assembly 10, the individual circuit assemblies are easily clamped into a stack containing multiple circuits which may be uniformly compression bonded throughout all of the columns 22-30 merely by applying clamping pressure without having pressure variations outside the pressure range specified for the operation of the compression bonded circuit elements. It should further be understood that the process for deforming the deformable spacers 124-132 may be implemented with any suitable pressing apparatus which has the capability of deforming the top surfaces 134-142 of the deformable spacers 124-132 into a single plane which is parallel to the flat portions of the assembled flat surface 14 and lid 20 and surfaces 186 and 188 of the heat sink 184. Furthermore, as described above with reference to FIG. 1, insulative spacers 107 not performing any circuit function may be disposed within any of the columns 22-30 inside of any of the hermetically sealed chambers 200 of the circuit assemblies 10 within a stack of circuit assemblies, as illustrated in FIG. 14, to permit circuit assemblies having differing configurations of compression bonded circuit elements to be compression loaded in a single stack.

FIG. 14 illustrates an exploded view of a stack a plurality of individual circuit assemblies 10 including heat sink assembly 184. Each of the individual circuit assemblies 10 is preferably, as illustrated in FIG. 13, with a heat sink 184 attached to and in thermal contact with the outside surface of the flat surface 14. The details of the individual circuit assemblies 10 have been omitted but it should be understood that they are preferably in accordance with FIGS. 1-3 and 13 but not limited thereto. Each of the compression bonded circuit elements (not illustrated) of the circuit assemblies 10 are compression bonded by a clamping mechanism 196 having a pair of opposed rigid surfaces 197 and 198 which are loaded by a force applied orthogonal thereto. The force may be applied by any conventional clamping mechanism (not illustrated) such as a C clamp or other clamps. The individual columns 22-30 of the circuit assemblies 10 described above are illustrated to identify the orientation of the individual compression bonded circuit elements (not illustrated) in each of the circuit assemblies 10 with respect to the stack of circuit. Because of the raised structure of the deformable spacers when the individual circuit assemblies 10 are assembled as in FIG. 3, the force applied by the surfaces 202 and 204 is equally loaded on each of the columns 22-30 to apply equal compressive force per unit area to each of the compression bonded circuit elements in each of the columns 22-30 within a desired pressure range. The mechanism for application of compressive force is conventional and per se does not form part of the present invention.

While the invention has been described in terms of its preferred embodiments, it should be understood that numerous modifications may be made thereto without departing from the spirit and scope of the invention as defined in the appended claims. For example, while the preferred embodiment of the invention has been described with each hermetically sealed circuit having a heat sink which does not contain fins or other heat radiating structures which increase the surface area of the heat sink or provide cooling fluid in contact with or flowing through the heat sink, it should be understood that any structure may be utilized in the heat sink to maximize its heat sinking ability. Furthermore, the invention is not limited to any particular clamping structure for applying the compressive force to compression bond the individual circuit elements to be compression bonded when the clamp is applied to apply compressive force to the columns. Furthermore, while preferably the individual circuit assemblies 10 are stacked in a stack of more than one circuit assembly per stack, it should be understood that the invention may be practiced with a single hermetically sealed circuit assembly with compressive force applied thereto. It is intended that all such modifications fall within the scope of the appended claims.

We claim:

1. A method for manufacturing a semiconductor device having at least one hermetically sealed compression bonded circuit assembly to compression bond circuit elements within the at least one circuit assembly comprising:

forming at least one hermetically sealed circuit assembly containing at least one circuit elements to be compression bonded disposed in a column-like manner to which is applied a force, and having first and second opposed walls;

positioning the first wall of the at least one hermetically sealed circuit assembly in a fixed position with respect to a first flat surface;

positioning a spring in alignment with the at least one circuit element to be compression bonded outside of the circuit assembly containing the circuit element to be compression bonded for each circuit assembly;

inelastically deforming the spring by application of a compression force by a second flat surface parallel to the first flat surface to deform the spring with a surface of the spring after deformation lying within a plane which is parallel to the opposed first and second walls of the circuit assembly, the inelastically deformed spring having a spring rate within a range which is a function of the circuit element that the spring is in axial alignment with;

positioning the at least one formed circuit assembly, including spring which has been deformed; and applying a compression force through top and bottom surfaces to compression bond the circuit element of the at least one circuit assembly with a pressure within a pressure range that the compression bonded circuit element is to be operated.

2. A method in accordance with claim 1 wherein:

the spring rate during thermal expansion of the circuit assembly caused by operation of the circuit assembly maintains a pressure applied to the compression bonded circuit element by the clamping force and by thermal expansion within the pressure range for operation of the compression bonded circuit element.

3. A method in accordance with claim 2 wherein:

the at least one circuit assembly consists of a plurality of circuit assemblies disposed in a stack and each of the circuit assemblies of the stack is identical.

4. A method in accordance with claim 2 wherein:
the at least one circuit assembly contains at least two different circuit elements to be compression bonded; and
the spring for each of the circuit elements to be compression bonded in the circuit assembly has a spring rate upon deformation in accordance with a specified range of pressures at which the different circuit elements to be compression bonded are to be operated.

5. A method in accordance with claim 1 wherein:
the at least one circuit assembly consists of a plurality of circuit assemblies disposed in a stack;
each circuit assembly is connected to and in thermal contact with a heat sink at the time of deformation;
the stacked circuit assemblies are clamped together with each circuit assembly being connected to the heat sink to which each circuit assembly was connected when deformation occurred; and
each heat sink has opposed surfaces which, except for a circuit assembly at a bottom of the stack, respectively face two circuit assemblies when the stack of circuit assemblies is clamped together.

6. A method in accordance with claim 2 wherein:
the at least one circuit assembly consists of a plurality of circuit assemblies disposed in a stack;
each circuit assembly is connected to and in thermal contact with a heat sink at the time of deformation;
the stacked circuit assemblies are clamped together with each circuit assembly being connected to the heat sink to which each circuit assembly was connected when deformation occurred; and
each heat sink has opposed surfaces which, except for a circuit assembly at a bottom of the stack, respectively face two circuit assemblies when the stack of circuit assemblies is clamped together.

7. A method in accordance with claim 3 wherein:
each circuit assembly is connected to and in thermal contact with a heat sink at the time of deformation;
the stacked circuit assemblies are clamped together with each circuit assembly being connected to the heat sink to which each circuit assembly was connected when deformation occurred; and
each heat sink has opposed surfaces which, except for a circuit assembly at a bottom of the stack, respectively face two circuit assemblies when the stack of circuit assemblies is clamped together.

8. A method in accordance with claim 4 wherein:
the at least one circuit assembly consists of plurality of circuit assemblies disposed in a stack and;
each circuit assembly is connected to and in thermal contact with a heat sink at the time of deformation;
the stacked circuit assemblies are clamped together with each circuit assembly being connected to the heat sink to which each circuit assembly was connected when deformation occurred; and
each heat sink has opposed surfaces which, except for a circuit assembly at a bottom of the stack, respectively face two circuit assemblies when the stack of circuit assemblies is clamped together.

9. A method in accordance with claim 5 wherein:
the spring for each of the circuit elements to be compression bonded in each circuit assembly has a spring rate upon deformation which causes operation within a specified range of pressures at which the circuit element to be compression bonded is to be operated.

10. A method in accordance with claim 1 wherein:
the spring is comprised of at least one ring with each ring being concentric with a columnar axis and having a C-shaped cross section in which opposite ends of the C are inelastically deformable toward each other.

11. A method in accordance with claim 1 wherein:
the spring is comprised of a lattice having open cells defining columns.

12. A method for manufacturing a semiconductor device having a plurality of hermetically sealed compression bonded circuit assemblies disposed in a stack to compression bond circuit elements within the individual circuit assemblies comprising:
forming a plurality of hermetically sealed circuit assemblies to form the semiconductor device with each circuit assembly containing a plurality of circuit elements to be compression bonded disposed in columns to which is applied a force and having first and second opposed walls;
positioning the first wall of each of the plurality of hermetically sealed circuit assemblies in a fixed position with respect to a first flat surface;
positioning a deformable shim in axial alignment with each of the circuit elements to be compression bonded outside of the circuit assembly containing the circuit element to be compression bonded for each of the circuit assemblies of the stack;
inelastically deforming the deformable shims of each circuit assembly by application of a compression force by a second flat surface parallel to the first flat surface to deform the shims of the circuit assembly with a surface of each spring after deformation lying within a plane which is parallel to the opposed first and second walls of the circuit assembly;
positioning the formed circuit assemblies, including deformable shims which have been deformed in the stack; and
applying a compressive force through top and bottom surfaces of the stack to compression bond each of the circuit elements of each of the circuit assemblies of the stack with a pressure within a pressure range that the compression bonded circuit elements are to be operated.

13. A method in accordance with claim 12 wherein:
each of the circuit assemblies of the stack are identical.

14. A method in accordance with claim 12 wherein:
each circuit assembly contains at least two different circuit elements to be compression bonded.

15. A method in accordance with claim 12 wherein:
each circuit assembly is connected to and in thermal contact with a heat sink at the time of deformation;
the stacked circuit assemblies are clamped together with each circuit assembly being connected to the heat sink to which each circuit assembly was connected when deformation occurred; and
each heat sink has opposed surfaces which, except for a circuit assembly at a bottom of the stack, respectively face two circuit assemblies when the stack of circuit assemblies is clamped together.

16. A method in accordance with claim 13 wherein:
each circuit assembly is connected to and in thermal contact with a heat sink at the time of deformation;
the stacked circuit assemblies are clamped together with each circuit assembly being connected to the heat sink to which each circuit assembly was connected when deformation occurred; and each heat sink has opposed surfaces which, except for a circuit assembly at a bottom of the stack, respectively face two circuit assemblies when the stack of circuit assemblies is clamped together.

17. A method in accordance with claim 14 wherein:
each circuit assembly is connected to and in thermal contact with a heat sink at the time of deformation;
the stacked circuit assemblies are clamped together with each circuit assembly being connected to the heat sink to which each circuit assembly was connected when deformation occurred; and
each heat sink has opposed surfaces which, except for a circuit assembly at a bottom of the stack, respectively face two circuit assemblies when the stack of circuit assemblies is clamped together.

18. A method in accordance with claim 12 wherein the deformed shim is a molded resin.

19. A method in accordance with claim 18 wherein the molded resin is in accordance with AMS 3726-1-2-3.

20. A method for manufacturing a semiconductor device having a plurality of hermetically sealed compression bonded circuit assemblies disposed in a stack to compression bond circuit elements within the individual circuit assemblies comprising:
forming a plurality of hermetically sealed circuit assemblies to form the semiconductor device with each circuit assembly containing a plurality of circuit elements to be compression bonded disposed in columns to which is applied a force and having first and second opposed walls;
positioning the first wall of each of the plurality of hermetically sealed circuit assemblies in a fixed position with respect to a first flat surface;
positioning a deformable spacer in axial alignment with each of the circuit elements to be compression bonded outside of the circuit assembly containing the circuit element to be compression bonded for each of the circuit assemblies of the stack;
inelastically deforming the deformable spacers of each circuit assembly by application of a compressive force by a second flat surface parallel to the first flat surface to deform the spacers of the circuit assembly with a surface of each of the deformable spacers after deformation lying within a plane which is parallel to the opposed first and second walls of the circuit assembly;
positioning the formed circuit assemblies, including spacers which have been deformed in the stack; and
applying a compressive force through top and bottom surfaces of the stack to compression bond each of the circuit elements of each of the circuit assemblies to the stack with a pressure within a pressure range that the compression bonded circuit elements are to be operated.

21. A method in accordance with claim 20 wherein:
the spacers are springs having a spring rate within a range which is a function of the compression bonded circuit element in which the spring is in axial alignment.

22. A method in accordance with claim 20 wherein: the spacers are deformable shims.

23. A method for manufacturing a hermetically sealed circuit assembly having a plurality of circuit elements to be compression bonded comprising:
forming a hermetically sealed circuit assembly containing a plurality of circuit elements to be compression bonded disposed in a spatial pattern, and having first and second opposed walls;
positioning the first wall of the hermetically sealed circuit assembly in a fixed position with respect to a first flat surface;
positioning a spring in axial alignment with each of the circuit elements to be compression bonded outside of the circuit assembly; and
inelastically deforming the springs of the circuit assembly by application of a compressive force by a second flat surface parallel to the first flat surface to deform the springs of the circuit assembly with a surface of each of the springs after deformation being disposed within a plane which is parallel to the opposed first and second walls of the circuit assembly, each inelastically deformed spring having a spring rate within a range which is a function of the circuit element in which the spring is in axial alignment.

24. A method in accordance with claim 23 further comprising:
attaching the deformed springs to the circuit assembly at a position identical to the position of the springs at which deformation took place.

25. A method for manufacturing a hermetically sealed circuit assembly having a plurality of circuit elements to be compression bonded comprising:
forming a hermetically sealed circuit assembly containing a plurality of circuit elements to be compression bonded disposed in spatial pattern, and having first and second opposed walls;
positioning the first wall of the hermetically sealed circuit assembly in a fixed position with respect to a first flat surface;
positioning a deformable shim in axial alignment with each of the circuit element to be compression bonded outside of the circuit assembly; and
inelastically deforming the deformable shims of the circuit assembly by application of a compressive force by a second flat surface parallel to the first flat surface to deform the shims of the circuit assembly with a surface of each spring after deformation being disposed within a plane which is parallel to the opposed first and second walls of the circuit assembly.

26. A method in accordance with claim 25 further comprising:
attaching the deformed shims to the circuit assembly at a position identical to the position of the springs at which deformation took place.

27. A method for manufacturing a hermetically sealed circuit assembly having a plurality of circuit elements to be compression bonded comprising:
forming a hermetically sealed circuit assembly containing a plurality of circuit elements to be compression bonded disposed in a spatial pattern, and having first and second opposed walls;
positioning the first wall to the hermetically sealed circuit assembly in a fixed position with respect to a first flat surface;
positioning a deformable spacer in axial alignment with each of the circuit element to be compression bonded outside of the circuit assembly; and
inelastically deforming the deformable spacers of the circuit assembly by application of a compressive force by a second flat surface parallel to the first flat surface to deform the spacers of the circuit assembly with a surface of each of the deformable spacers after deformation being disposed within a plane which is parallel to the opposed first and second walls of the circuit assembly.

28. A method in accordance with claim 27 further comprising:
attaching the deformed spacers to the circuit assembly at a position identical to the position of the springs at which deformation took place.

29. A method in accordance with claim 28 wherein: the spacers are springs.

30. A method in accordance with claim 28 wherein: the spacers are shims.

31. A method in accordance with claim 1 wherein: the column-like circuit element has a thickness after the deformation of the springs measured between the deformed spring and one of the first and second walls which is substantially identical.

32. A method in accordance with claim 12 wherein: the plurality of columns of circuit elements each have a thickness after deformation of the shims measured between the deformed shims and one of the first and second walls which is substantially identical.

33. A method in accordance with claim 20 wherein: the plurality of columns of circuit elements each have a thickness after the deformation of the spacers measured between the deformed spacers and one of the first and second walls which is substantially identical.

34. A method in accordance with claim 31 wherein: prior to inelastic deformation of the spring a heat sink having parallel opposed surfaces has one of the opposed surfaces facing one of the walls.

35. A method in accordance with claim 32 wherein: prior to inelastic deformation of the shims a heat sink having parallel opposed surfaces has one of the opposed surfaces facing one of the walls.

36. A method in accordance with claim 33 wherein: prior to inelastic deformation of the spacers a heat sink having parallel opposed surfaces has one of the opposed surfaces facing one of the walls.

37. A method in accordance with claim 23 wherein: the plurality of columns of circuit elements each have a thickness after the deformation of the springs measured between the deformed springs and one of the first and second walls which is substantially identical.

38. A method in accordance with claim 25 wherein: the plurality of columns of circuit elements each have a thickness after the deformation of the shims measured between the deformed shims and one of the first and second walls which is substantially identical.

39. A method in accordance with claim 27 wherein: the plurality of columns of circuit elements each have a thickness after the deformation of the spacers measured between the deformed spacers and one of the first and second walls which is substantially identical.

* * * * *